United States Patent
Yeung et al.

(10) Patent No.: US 8,484,539 B1
(45) Date of Patent: Jul. 9, 2013

(54) CONTROLLING POWER CONSUMPTION IN ITERATIVE ECC PROCESSING SYSTEMS

(75) Inventors: Kwok W. Yeung, Milpitas, CA (US); Kin Man Ng, Cupertino, CA (US)

(73) Assignee: SK hynix memory solutions inc., San Jose, CA (US)

( * ) Notice: Subject to any disclaimer, the term of this patent is extended or adjusted under 35 U.S.C. 154(b) by 526 days.

(21) Appl. No.: 12/802,133

(22) Filed: May 28, 2010

Related U.S. Application Data

(60) Provisional application No. 61/268,183, filed on Jun. 9, 2009.

(51) Int. Cl.
*H03M 13/00* (2006.01)
*H03M 13/03* (2006.01)
*G06F 11/00* (2006.01)

(52) U.S. Cl.
USPC ............ 714/774; 714/795; 714/801; 714/755

(58) Field of Classification Search
USPC .................. 714/755, 774, 795, 801; 375/262, 375/341
See application file for complete search history.

(56) References Cited

U.S. PATENT DOCUMENTS

| | | | |
|---|---|---|---|
| 6,210,036 B1 * | 4/2001 | Eberle et al. .................. | 374/141 |
| 6,690,367 B2 * | 2/2004 | Akimoto ....................... | 345/211 |
| 7,725,800 B2 * | 5/2010 | Yang et al. .................... | 714/755 |
| 8,170,606 B2 * | 5/2012 | Dorsey et al. ............. | 455/552.1 |
| 2008/0276156 A1 | 11/2008 | Gunnam et al. | |
| 2008/0301521 A1 | 12/2008 | Gunnam et al. | |
| 2009/0089648 A1 * | 4/2009 | Tsui et al. ..................... | 714/795 |
| 2011/0289380 A1 * | 11/2011 | Wilkerson et al. ............. | 714/763 |
| 2012/0256492 A1 * | 10/2012 | Song et al. ....................... | 307/66 |
| 2012/0272119 A1 * | 10/2012 | Buchmann et al. ........... | 714/755 |

* cited by examiner

*Primary Examiner* — Phung M Chung
(74) *Attorney, Agent, or Firm* — Van Pelt, Yi & James LLP

(57) ABSTRACT

An iterative error correction coding (ECC) decoder is configured to operate in a first higher-power and higher-performance operating mode. At least some part of a system that includes the iterative ECC decoder is monitored. It is determining whether to switch the iterative ECC decoder from the first higher-power and higher-performance operating mode to a second lower-power and lower-performance operating mode based at least in part on the monitoring. The iterative ECC decoder is configured to operate in the second lower-power and lower-performance operating mode in the event it is determined to switch operating modes.

20 Claims, 7 Drawing Sheets

$N_{1,max} = 3$
$N_{2,max} = 6$

Example in which a system would not switch to a second lower-power and lower-performance operating mode

400 ←

| | S1 | S2 | S3 | S4 | S5 | S6 | S7 | S8 | S9 | S10 |
|---|---|---|---|---|---|---|---|---|---|---|
| $N_{1,iterations}$ | 1 | 1 | ╳ | 1 | 2 | 1 | 1 | 1 | ╳ | 1 |
| $N_{2,iterations}$ | 1 | 1 | ╳ ~~18~~ | 2 | 7 | 1 | 1 | 2 | ╳ ~~18~~ | 1 |

↑ 402    ↑ 406    ↑ 404

Example in which a system would switch to a second lower-power and lower-performance operating mode

450 ←

| | S1 | S2 | S3 | S4 | S5 | S6 | S7 | S8 | S9 | S10 |
|---|---|---|---|---|---|---|---|---|---|---|
| $N_{1,iterations}$ | 1 | 1 | ╳ | 3 | ╳ | ╳ | 3 | ╳ | ╳ | 1 |
| $N_{2,iterations}$ | 2 | 1 | ╳ ~~18~~ | 16 | ╳ ~~18~~ | ╳ ~~18~~ | 17 | ╳ ~~18~~ | ╳ ~~18~~ | 2 |

CONTROLLING POWER CONSUMPTION IN ITERATIVE ECC PROCESSING SYSTEMS

CROSS REFERENCE TO OTHER APPLICATIONS

This application claims priority to U.S. Provisional Patent Application No. 61/268,183 entitled CONTROLLING PEAK POWER CONSUMPTION IN ITERATIVE ECC PROCESSING SYSTEMS filed Jun. 9, 2009 which is incorporated herein by reference for all purposes.

BACKGROUND OF THE INVENTION

Error correcting codes (ECC), such as low-density parity-check (LDPC) codes, are being used increasingly in storage devices such as hard-disk systems and solid-state systems. Sometimes to decode these codes, iterative ECC decoding is performed where a decoder operates on encoded data for multiple iterations. Iterative decoding often consumes higher power, particularly if the system is attempting to decode many pieces of fairly noisy data (e.g., an off-track servo or unusually noisy media) where the ECC decoder is required to perform a larger than average number of iterations. As a result, the peak power consumption of the system may spike, resulting in increased temperature which is undesirable. It would be desirable to develop techniques to control power consumption and/or temperature in systems that include iterative ECC decoders.

BRIEF DESCRIPTION OF THE DRAWINGS

Various embodiments of the invention are disclosed in the following detailed description and the accompanying drawings.

FIG. 4 is a diagram showing an embodiment of situations in which a system would (and would not) switch from a higher-power, higher-performance operating mode to a lower-power, lower-performance operating mode.

FIG. 5 is a state diagram showing an embodiment of three operating modes and corresponding maximum numbers of iterations that a soft output Viterbi decoder and an iterative ECC decoder can operate for.

FIG. 6 is a diagram showing an embodiment of a controller configured to switch operating modes based on an aggregated number of iterations an iterative ECC decoder operates for.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
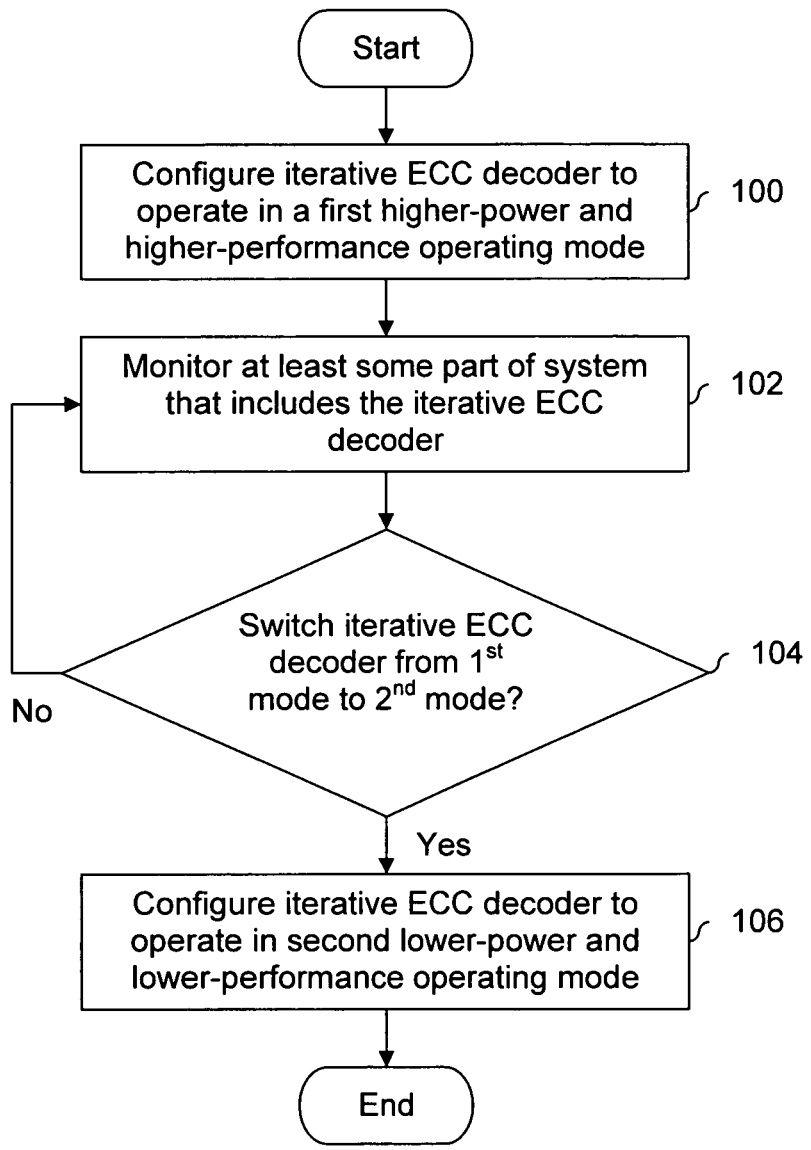
FIG. 1 is a flowchart illustrating an embodiment of a process for controlling power consumption in an iterative ECC processing system.

FIG. 1 is a flowchart illustrating an embodiment of a process for controlling power consumption in an iterative ECC processing system. The example process shown herein is performed by a controller included in a read/receive processor. In various embodiments, the controller is a general purpose processor configured to execute the steps described below or may be specially configured (e.g., temporarily or permanently) to perform the steps described below. Some examples of the latter include field-programmable gate arrays (FPGAs) and application-specific integrated circuits (ASICs).

At 100, an iterative ECC decoder is configured to operate in a first higher-power and higher-performance operating mode. In some embodiments, this includes setting a maximum number of iterations that the iterative ECC decoder can operate for. In some embodiments, an iterative ECC decoder can operate in multiple modes and the maximum number of iterations set at 100 (in those such embodiments) is the largest of all modes.

At least some part of a system that includes the iterative ECC decoder is monitored at 102. In some embodiments, this includes using a temperature sensor. In some embodiments, this includes obtaining status information from an iterative ECC decoder. For example, a number of iterations required to properly decode an encoded sector is obtained. (For brevity, the term "sector" is used herein but it is to be understood the technique applies to any unit/group of data.) In some cases, multiple such number of iterations is obtained for multiple sectors.

At 104 it is determined whether to switch an iterative ECC decoder from the first higher-power and higher-performance operating mode to a second lower-power and lower-performance operating mode based at least in part on the monitoring. For example, in embodiments where a temperature sensor is used, if a certain temperature is reached, it is decided to switch to the lower-power and lower-performance mode.

Some examples where a number of iterations required to decode a sector are described in further detail below.

If it is determined at 104 not to switch operating modes, the process returns to monitoring at 102. For example, newer information (e.g., current temperature or current status information) associated with newly received encoded sectors may be obtained.

If it is determined at 104 to switch operating modes, the iterative ECC decoder is configured to operate in the second lower-power and lower-performance operating mode at 106. In some embodiments this includes reducing a maximum number of iterations that the iterative ECC decoder can operate for.

Figure 2A:
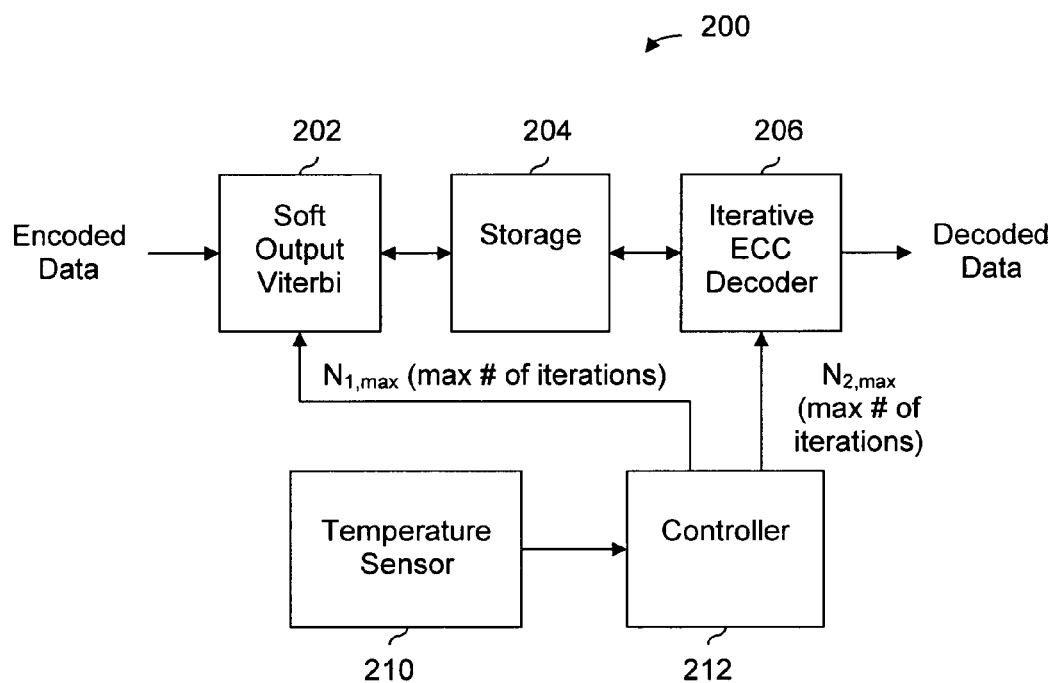
FIG. 2A is a diagram showing an embodiment of a system that monitors temperature and decides whether to switch to a lower-power and lower-performance operating mode based at least in part on temperature.

FIG. 2A is a diagram showing an embodiment of a system that monitors temperature and decides whether to switch to a lower-power and lower-performance operating mode based at least in part on temperature. In the example shown, system 200 includes two decoders: soft output Viterbi decoder (202) and iterative ECC decoder (206). Encoded data is input by soft output Viterbi decoder 202 which writes its output to storage 204. In some embodiments, the encoded data is stored on and is obtained from storage (e.g., magnetic disk media). In some embodiments, the encoded data is received in a communication (e.g., received over a wireless or wired transmission medium).

Information is exchanged between soft output Viterbi decoder 202 and iterative ECC decoder 206 via storage 204. Iterative ECC decoder 206 may be working on another sector and storage 204 is used to store information until iterative ECC decoder 206 is free. When free, iterative ECC decoder 206 retrieves the output of soft output Viterbi decoder 202 from storage 204. If iterative ECC decoder 206 is able to decode the information properly, the decoded data is output by iterative ECC decoder 206. The interaction of soft output Viterbi decoder 202 and iterative ECC decoder 206 is described in further detail below.

Temperature sensor 210 outputs a temperature to controller 212. Controller 212 performs the process described in FIG. 1 and uses the temperature information to decide whether to switch from a first operating mode to a second lower-power and lower-performance operating mode. For example, if the temperature exceeds a certain (e.g., programmable) temperature then controller 212 decides to switch operating modes. Controller 212 passes $N_{1,max}$ and $N_{2,max}$ (a maximum number of iterations) to soft output Viterbi decoder 202 and iterative ECC decoder 206, respectively. In this example, if controller 212 decides to switch to a lower-power, lower-performance operating mode then $N_{1,max}$ and/or $N_{2,max}$ is reduced.

In some embodiments, controller 212 is configured to return the system to a higher-power, higher-performance operating mode if appropriate. For example, if the temperature drops below a certain (e.g., configurable) temperature then controller 212 may decide to return to a higher-power, higher-performance operating mode. In some embodiments, a threshold temperature to switch from a higher-power, higher-performance operating mode to a lower-power, lower-performance operating mode is not necessarily the same as a second threshold temperature to switch in the other direction. In some embodiments, the threshold temperature(s) are selected such that they take into account a delay between the time that the operating mode is switched to the time the temperature drops/rises. For example, the threshold temperature to switch to a lower-power, lower-performance operating mode may be lower than a specified maximum temperature, since the temperature may continue to rise for a short period of time after the lower-power, lower-performance operating mode is active.

In some embodiments, iterative ECC decoder 206 is a low-density parity-check (LDPC) decoder. In some other embodiments, iterative ECC decoder 206 may be a Reed Solomon decoder.

Figure 2B:
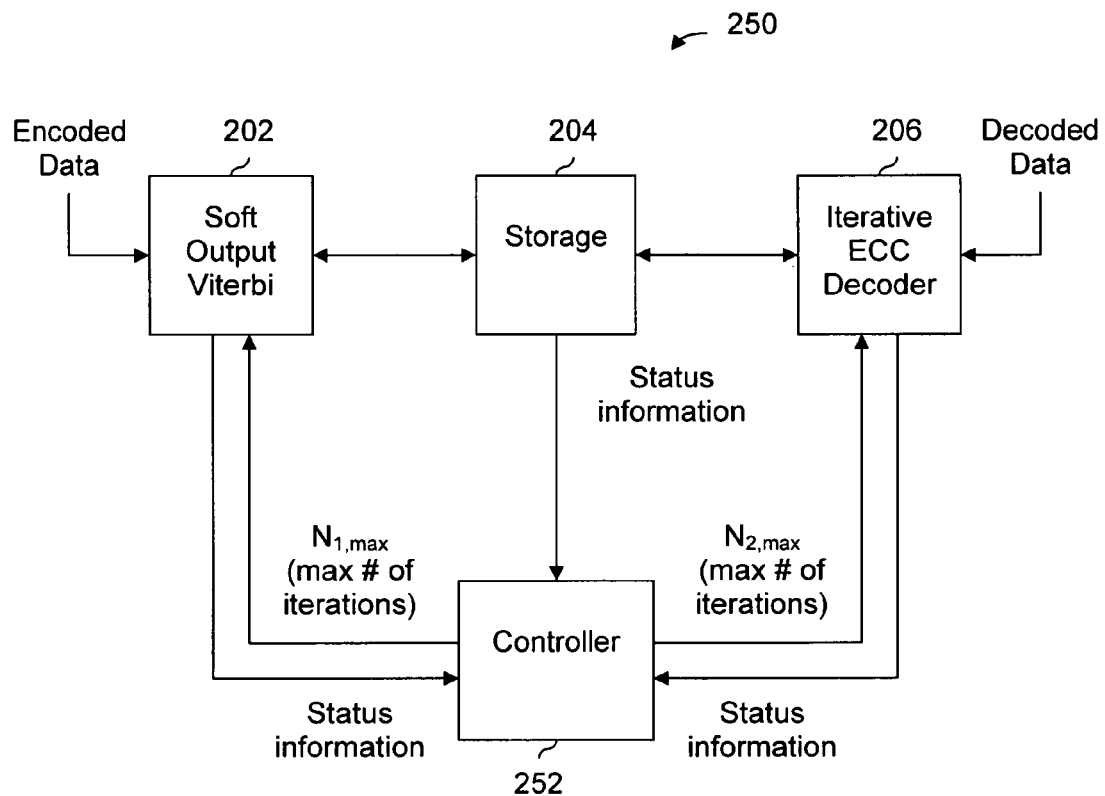
FIG. 2B is a diagram showing an embodiment of a system that monitors status information and decides whether to switch to a lower-power and lower-performance operating mode based at least in part on the status information.

In some applications, there may be no temperature sensor available and/or access to a temperature sensor may be unavailable and the system shown in FIG. 2B is used. For example, a temperature sensor would add to a bill of materials (i.e., a list of components to build a printed circuit board or system) and because of price pressure, manufacturers may want to keep the bill of materials to a minimum.

FIG. 2B is a diagram showing an embodiment of a system that monitors status information and decides whether to switch to a lower-power and lower-performance operating mode based at least in part on the status information. System 250 contains some of the same components shown in system 200 of FIG. 2A and for brevity those components are not described herein.

In the example shown, controller 252 uses status information from soft output Viterbi decoder 202, storage 204, and/or iterative ECC decoder 206 to decide whether to switch from a higher-power, higher-performance operating mode to a lower-power, lower-performance once. In general, controller 252 is attempting to detect situations in which many sectors (relatively close to each other) have a lot of noise. Controller 252 (at least in this example) does not care and will not switch operating modes if a sector here or sector there is uncorrectable or correctable but require many iterations. There are a variety of ways to detect this. In some embodiments, controller 252 monitors the number of "slots" used in storage 204 and if a large number or percentage of slots in storage 204 are being used for a certain amount of time the controller decides to switch states. In some embodiments, a number of iterations required by soft output Viterbi decoder 202 and/or iterative ECC decoder 206 to decode a sector is used. In some embodiments, a number of iterations for multiple sectors is obtained and used. In some embodiments, a number of iterations for multiple sectors is combined or aggregated (e.g., by averaging a number of iterations required).

As in the previous example, if controller 252 decides to switch to a lower-power, lower-performance state, controller 252 reduces $N_{1,max}$ and/or $N_{2,max}$ passed to soft output Viterbi decoder 202 and iterative ECC decoder 206, respectively. Also as described above, controller 252 in some embodiments is configured to continue monitoring status information and may (if appropriate) return the system to a higher-power, higher-performance operating mode by returning $N_{1,max}$ and/or $N_{2,max}$ to their original values or, more generally, by increasing a maximum number of iterations.

Figure 3:
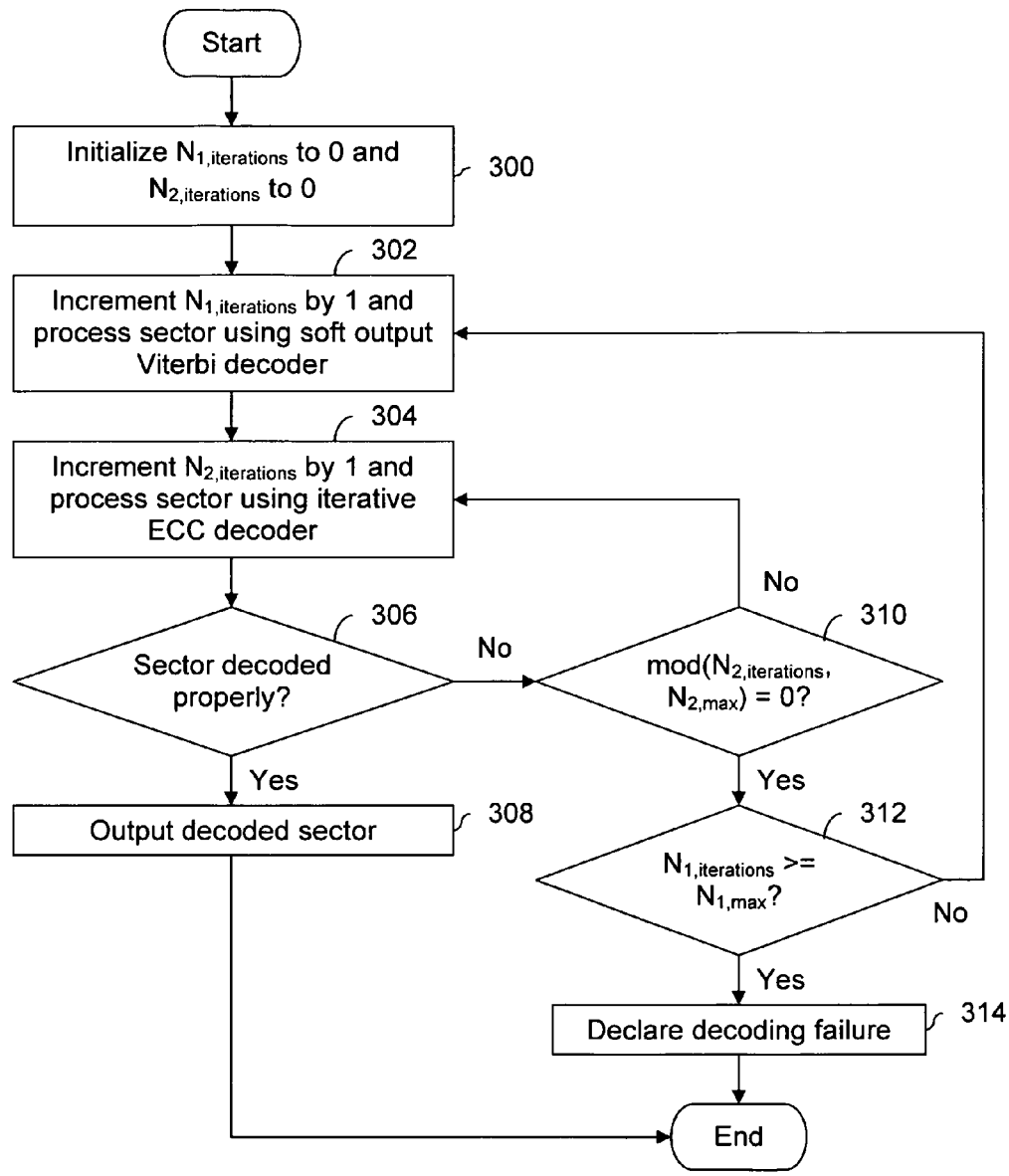
FIG. 3 is a flowchart illustrating an embodiment of interaction between a soft output Viterbi decoder and an iterative ECC decoder and number of iterations (for both) required to decode encoded data.

FIG. 3 is a flowchart illustrating an embodiment of interaction between a soft output Viterbi decoder and an iterative ECC decoder and number of iterations (for both) required to decode encoded data. FIGS. 2A and 2B show an example of how a soft output Viterbi decoder and an iterative ECC decoder may be coupled to each other. In the example shown, processing of a sector of data is shown; the process may be repeated for additional sectors. In some embodiments, a system is configured to operate on multiple sectors simultaneously (e.g., a soft output Viterbi decoder processes one sector while an iterative ECC decoder processes another sector). For clarity, the example process shown herein is for a single sector. Although not necessarily shown in this example, in some other embodiments a decoder (e.g., Viterbi decoder or ECC decoder) may operate on another sector if it is free to do so.

At 300, $N_{1,iterations}$ is initialized to 0 and $N_{2,iterations}$ is initialized to 0. In this example, $N_{1,iterations}$ is a count of the number of iterations performed by a soft output Viterbi decoder on a sector and $N_{2,iterations}$ is a count of the number of iterations performed by an iterative ECC decoder on a sector.

At 302, $N_{1,iterations}$ is incremented by 1 and a sector is processed using a soft output Viterbi decoder. $N_{2,iterations}$ is incremented by 1 and a sector is processed using an iterative ECC decoder at 304. For example, in FIGS. 2A and 2B, soft output Viterbi decoder 202 and iterative ECC decoder may exchange information via storage 204.

It is determined at 306 whether a sector was decoded properly. If so, a decoded sector is output at 308. If not, it is determined at 310 whether mod($N_{2,iterations}$, $N_{2,max}$) is equal to 0. As used herein, $N_{1,max}$ and $N_{2,max}$ are the maximum number of iterations a soft output Viterbi decoder and iterative ECC decoder are respectively permitted to operate on a particular sector. To illustrate the decision at 310, the table below shows an example where $N_{1,max}$=2 and $N_{2,max}$=3.

| $N_{1,iteration}$ ($N_{1,max}$ = 2) | $N_{2,iteration}$ ($N_{2,max}$ = 3) | Description |
|---|---|---|
| 0 | 0 | Neither decoder has operated on the sector |
| 1 | 0 | Viterbi operates on sector for the first time |
| 1 | 1 | Iterative ECC decoder operates on sector for the first time |
| 1 | 2 | Iterative ECC decoder tries again |
| 1 | 3 | Iterative ECC decoder tries again and reaches max . . . |
| 2 | 3 | . . . so the Viterbi tries again |
| 2 | 4 | Iterative ECC decoder tries again |
| 2 | 5 | Iterative ECC decoder tries again |
| 2 | 6 | Iterative ECC decoder tries again. Both maximums reached. Declare failure if unsuccessful after this iteration. |

The leftmost column of the table above shows a count of the number of iterations performed by a soft output Viterbi decoder and the center column shows a count of the number of iterations performed by an iterative ECC decoder. In the example above, when $N_{1,iterations}$=1 and $N_{2,iterations}$=3, the decision at 310 is "Yes" since $N_{2,max}$=3. Similarly, the decision at 310 is "Yes" for $N_{1,iterations}$=2 and $N_{2,iterations}$=6. For $N_{1,iterations}$=1 and $N_{2,iterations}$=1 as well as $N_{1,iterations}$=1 and $N_{2,iterations}$=2 (and other cases) the decision at 310 is "No".

Returning to FIG. 3, if the decision at 310 is "No" then $N_{2,iterations}$ is incremented and the sector is processed (again) using the iterative ECC decoder at 304. If the decision at 310 is "Yes" then it is determined at 312 whether $N_{1,iterations}$ is greater than or equals to $N_{1,max}$. For example, referring back to the table above, the decision at 312 is "No" for $N_{1,iterations}$=1 and $N_{2,iterations}$=1 and is "Yes" for $N_{1,iterations}$=2 and $N_{2,iterations}$=6 since $N_{1,max}$=2.

If the decision at 312 is "No" then $N_{1-iterations}$ is incremented and a sector is processed (again) using a soft output Viterbi decoder at 302. If the decision at 312 is "Yes" then a decoding failure is declared at 314. Put another way, in the example above the iterative ECC decoder has 3 attempts (since $N_{2,max}$=3) to decode the sector before the soft output Viterbi decoder (again) attempts to decode the sector assuming the Viterbi has not exceeded its own maximum of 2 iterations since $N_{1,max}$=2.

In the examples described herein, $N_{2,iterations}$ is not reset (e.g., back to 0) when a soft output Viterbi decoder again attempts to decode a sector (e.g., when going from decision 312 to step 302). See, for example, the table above when the count goes from $N_{1,iterations}$=1 and $N_{2,iterations}$=3 to $N_{1,iterations}$=2 and $N_{2,iterations}$=3. In some other embodiments, that count would go from $N_{1,iterations}$=1 and $N_{2,iterations}$=3 to $N_{1,iterations}$=2 and $N_{2,iterations}$=0. The technique described herein is not limited to any particular counting technique associated with $N_{1,iterations}$ or $N_{2,iterations}$.

FIG. 4 is a diagram showing an embodiment of situations in which a system would (and would not) switch from a higher-power, higher-performance operating mode to a lower-power, lower-performance operating mode. In the example shown, $N_{1,max}$=3 and $N_{2,max}$=6. Tables 400 and 450 show the number of iterations performed by a soft output Viterbi decoder ($N_{1,iterations}$) and the number of iterations performed by an iterative ECC decoder ($N_{2,iterations}$) on a given sector. In this example 10 sectors (S1-S10) are shown. An "X" for a sector indicates that both maximums ($N_{1,max}$ and $N_{2,max}$) were reached and the system was unable to successfully decode that sector. Table 400 shows an example in which a system would not switch to a second lower-power and lower-performance operating mode and table 450 shows an example in which a system would switch to a second lower-power and lower-performance operating mode.

In table 400, sectors 3 (402) and 9 (404) were unable to be decoded and the counts for those two sectors were both $N_{1,iterations}$=3 and $N_{2,iterations}$=18. However, the other sectors were able to be decoded with relatively few iterations ($N_{1,iterations}$=1 and $N_{2,iterations}$=1 or $N_{2,iterations}$=2) and the next largest number of iterations is sector 5 (406) which has a count of $N_{1,iterations}$=2 and $N_{2,iterations}$=7. In this example, since the "bad" sectors 3 and 9 are relatively far apart, the system does not switch to a lower-power, lower-performance state. The system in this embodiment is looking for situations in which the decoders are performing relatively large number of iterations on a sector over prolonged periods of time. Table 450 shows one such example.

In table 450, the system had to expend a large number of iterations during sectors 3 thru 9 (451-457). Sectors 3 (451), 5-6 (453-454), and 8-9 (456-457) were uncorrectable with counts of $N_{1,iterations}$=3 and $N_{2,iterations}$=18 and sectors 4 (452) and 7 (455) had counts of $N_{1,iterations}$=3 and $N_{2,iterations}$=16 and $N_{1,iterations}$=3 and $N_{2,iterations}$=17, respectively.

The system in this example will switch to a lower-power, lower-performance state (e.g., by reducing $N_{1,max}$ and/or $N_{2,max}$) based on the iterations required during sectors 3 thru 9 (451-457). The large number of iterations required during sectors 3 thru 9 (451-457) causes the power consumption to "spike" and as a result the temperature goes up. A benefit of switching to a lower-power, lower-performance state is that the power consumption goes down and the temperature will correspondingly go down. For example, as a result of the lower maximum(s) the decoders will perform fewer iterations overall per sector, reducing the power consumed per sector. In general, it is undesirable for a system to operate at high temperatures (e.g, because semiconductors operate faster in lower temperatures, because packages are designed with maximum temperatures in mind, etc.).

In various embodiments, a system is configured to switch operating modes under various conditions. Put another way, status information (e.g., $N_{1,iterations}$ or $N_{2,iterations}$) which causes one embodiment to switch operating modes may not necessarily cause another embodiment to switch modes and the conditions shown herein are merely exemplary.

Figure 5:
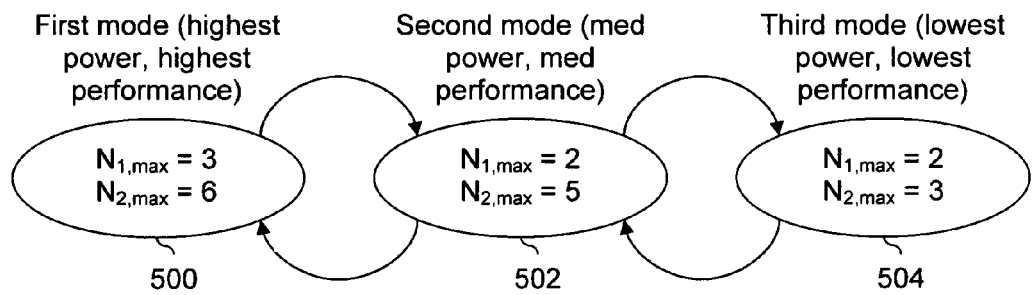

FIG. 5 is a state diagram showing an embodiment of three operating modes and corresponding maximum numbers of iterations that a soft output Viterbi decoder and an iterative ECC decoder can operate for. In the example shown, mode 500 is the highest-powered, highest-performance operating mode and mode 504 is the lowest-powered, lowest-performance operating mode. The operating modes shown herein are merely exemplary and any number of operating modes and any corresponding maximums may be used.

The system in this example begins in mode 500 where $N_{1,max}=3$ and $N_{2,max}=6$. The only permitted transition from this mode is to mode 502 where $N_{1,max}=2$ and $N_{2,max}=5$. In mode 502, the system can transition to either mode 500 or 504. In mode 504, $N_{1,max}=2$ and $N_{2,max}=3$ and the only permitted transition is to mode 502.

Figure 6:
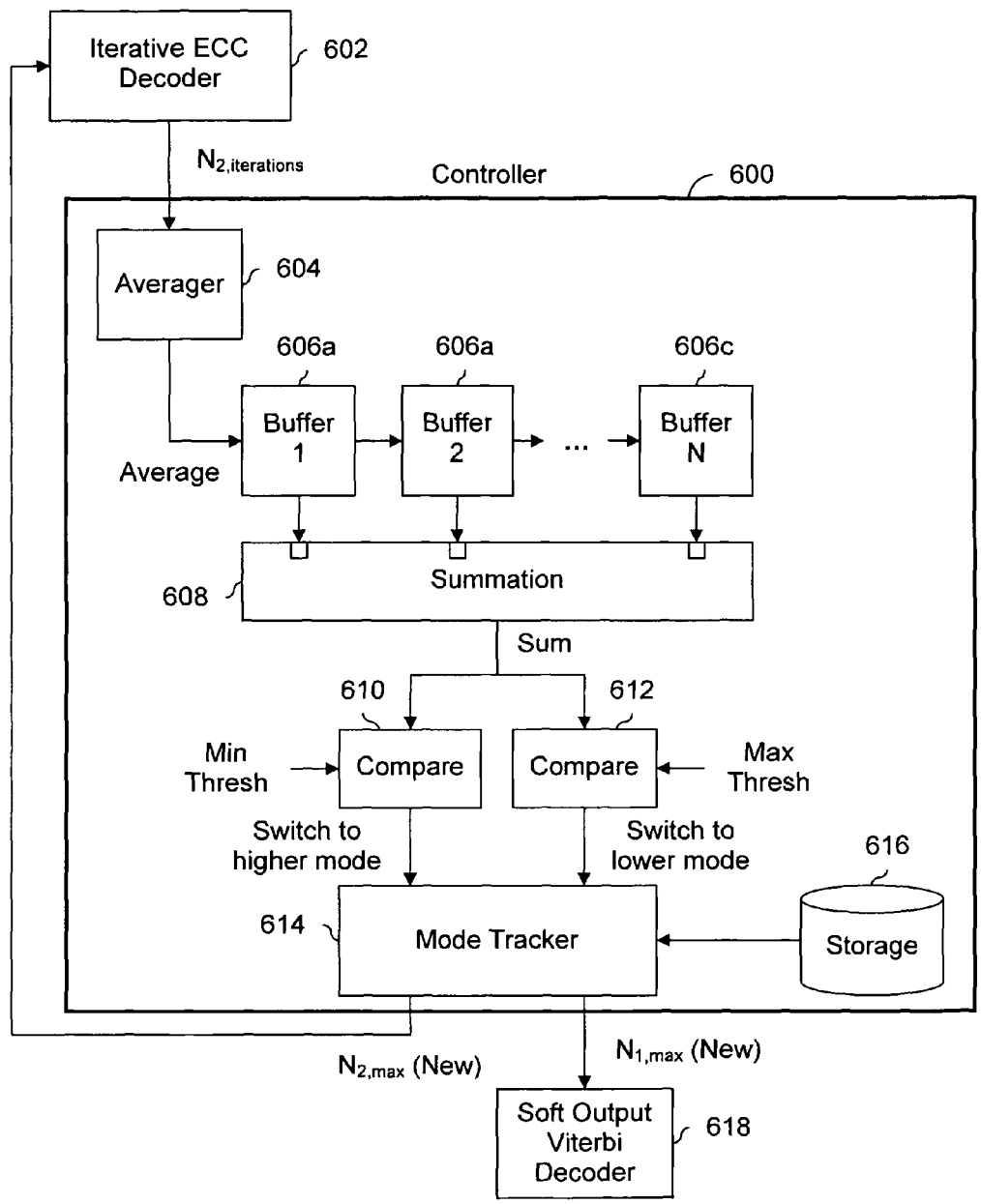

FIG. 6 is a diagram showing an embodiment of a controller configured to switch operating modes based on an aggregated number of iterations an iterative ECC decoder operates for. In some embodiments, controller 252 in FIG. 2B is configured as shown.

In the example shown, controller 600 is configured to receive the number of iterations iterative ECC decoder 602 operates on for each sectors. For example, referring to table 450 in FIG. 4, the sequence of $N_{2,iterations}=2, 1, 18, 16, 18, 18, 17$, etc. is passed from iterative ECC Decoder 602 to averager 604 in controller 600. In this example, averager 604 averages non-overlapping groups of $N_{2,iterations}$. For example, if averager 604 averages 4 items at a time, then the $N_{2,iterations}$ values for sectors 1-4 are averaged together, the $N_{2,iterations}$ values for sectors 5-8 are averaged together, and so on.

The averages output by averager 604 are passed to buffer 606a. Buffer 606a is the first buffer in an array of N buffers, buffers 606a-606c. Each buffer stores an average and passes it to the next buffer when a new average value is received. The averages stored in buffers 606a-606c are passed to summation block 608. The sum is passed from summation block 608 to comparators 610 and 612.

Comparator 610 compares the sum to a minimum threshold and flags or otherwise detects when the sum is less than the minimum threshold. This signal is used to indicate to mode tracker 614 to switch to a higher-power, higher-performance mode (e.g., because the decoders have been able to decode sectors over some window using relatively few iterations). Comparator 612 compares the sum to a maximum threshold and flags or otherwise detects when the sum is greater than the maximum threshold. This signal is used to signal to mode tracker 614 to switch to a lower-power, lower-performance mode (e.g., because the temperature has increased as a result of the decoders operating for a relatively large number of iterations for a relatively sustained period of time). In some embodiments, the minimum threshold and/or maximum threshold are determined by simulation.

Mode tracker 614 keeps track of which operating mode the system is currently in and switches modes based on the signals passed to it from comparators 610 and 612. The various values of $N_{1,max}$ and $N_{2,max}$ associated with the various states are stored in storage 616. Mode tracker 614 retrieves the new values of $N_{1,max}$ and $N_{2,max}$ for the next state from storage 616 and passes them to soft output Viterbi decoder 618 and iterative ECC decoder 202, respectively. In some embodiments, one of $N_{1,max}$ or $N_{2,max}$ may remain the same even though the system changes operating modes (see, e.g., how $N_{1,max}$ is the same in modes 502 and 504 in FIG. 5).

In various embodiments, passing (new) values of $N_{1,max}$ or $N_{2,max}$ occurs in a variety of ways. In some embodiments, a register associated with $N_{1,max}$ or $N_{2,max}$ is written to. In some embodiments, a mode controller may wait until a decoder has completed processing of a sector and only changes a maximum when the decoder is "idle." In some embodiments, the change can occur at anytime (e.g., even if a decoder is in the middle of decoding a sector).

Using averager 604 enables fewer pieces of information to be stored and thus reduces the amount of memory required. For example, it is desired to use information from the last X sectors in decision making. If averager 604 is not used, N (i.e., the number of buffers) must be greater than or equal to X in order for information from the last X sectors to be used. In contrast, by using averager 604, fewer buffers are required. For example, if averager 604 is configured to average information for 4 sectors then N must be greater than or equal to $\lambda/4$. In some embodiments, the number of sectors averager 604 is configured to average and/or the number of buffers (i.e., the value of N) is determined by simulation. In some embodiments, the number of sectors averager 604 is configured to average and/or the value of N is/are configurable.

In the example shown herein, controller 600 uses $N_{2,iterations}$ from iterative ECC decoder 602 but not $N_{1,iterations}$ (not shown) from soft output Viterbi decoder 618. In this particular embodiment, $N_{2,iterations}$ from is not reset (e.g., to 0) when $N_{2,max}$ is reached and the soft output Viterbi decoder attempts the sector again. In other embodiments where $N_{2,iterations}$ is reset the system shown herein is modified accordingly (e.g., and $N_{1,iterations}$ (not shown) from soft output Viterbi decoder 618 is used by controller 600). In some other embodiments, three or more thresholds/comparators are used.

In some embodiments, different weights are used for an iteration of the soft output Viterbi and an iteration of the iterative ECC decoder. For example, the decoders may consume different amounts of power (and thus produce different amounts of heat) for a single iteration. Weights that reflect these differences in power consumption are used in some embodiments. For example, if one decoder consumes 4 times the power of the other, a single iteration of that decoder may be assigned a weight of 4 and a single iteration of the other decoder may be assigned a weight of 1, so that the total for a given sector is $(4 \times N_{decoder\ i, iterations})+(1 \times N_{decoder\ j, iterations})$.

Although the foregoing embodiments have been described in some detail for purposes of clarity of understanding, the invention is not limited to the details provided. There are many alternative ways of implementing the invention. The disclosed embodiments are illustrative and not restrictive.

The invention claimed is:

1. A system, comprising:
    an iterative error correction coding (ECC) decoder; and
    a controller configured to:
        configure the iterative ECC decoder to operate in a first higher-power and higher-performance operating mode;
        monitor at least some part of a system that includes the iterative ECC decoder;
        decide whether to switch the iterative ECC decoder from the first higher-power and higher-performance operating mode to a second lower-power and lower-performance operating mode based at least in part on the monitoring; and
        configure the iterative ECC decoder to operate in the second lower-power and lower-performance operating mode in the event the controller decides to switch operating modes.

2. The system recited in claim 1, wherein:
    monitoring includes using a temperature sensor; and
    deciding is based at least in part on temperature information from the temperature sensor.

3. The system recited in claim 1, wherein:
    monitoring includes obtaining status information from the iterative ECC decoder; and
    deciding is based at least in part on the status information.

4. The system recited in claim 1, wherein the iterative ECC decoder includes a low-density parity-check (LDPC) decoder.

5. The system recited in claim 1 further comprising:
a soft output Viterbi decoder; and
storage, wherein the soft output Viterbi decoder and the iterative ECC decoder are configured to exchange data via the storage.

6. The system recited in claim 5, wherein:
monitoring includes obtaining a first number of iterations that the soft output Viterbi decoder operated for and obtaining a second number of iterations that the iterative ECC decoder operated for; and
deciding is based at least in part on the first number of iterations and the second number of iterations.

7. The system recited in claim 6, wherein the first number of iterations and the second number of iterations are a number of iterations that the soft output Viterbi decoder and the iterative ECC decoder, respectively, operated on a same sector from a disk storage device.

8. The system recited in claim 5, wherein configuring the iterative ECC decoder to operate in a second lower-power and lower-performance operating mode includes reducing a first maximum number of iterations that the soft output Viterbi decoder can operate for and/or reducing a second maximum number of iterations that the iterative ECC decoder can operate for.

9. The system recited in claim 1, wherein configuring the iterative ECC decoder to operate in a second lower-power and lower-performance operating mode includes reducing a maximum number of iterations that the iterative ECC decoder can operate for.

10. The system recited in claim 1, wherein the controller is further configured to:
decide whether to return the iterative ECC decoder to the first higher-power and higher-performance operating mode; and
configure the iterative ECC decoder to operate in the first higher-power and higher-performance operating mode in the event the controller decides to return the iterative ECC decoder to the first higher-power and higher-performance operating mode.

11. A method, comprising:
using a processor to configure an iterative error correction coding (ECC) decoder to operate in a first higher-power and higher-performance operating mode;
monitoring at least some part of a system that includes the iterative ECC decoder;
using the processor to decide whether to switch the iterative ECC decoder from the first higher-power and higher-performance operating mode to a second lower-power and lower-performance operating mode based at least in part on the monitoring; and
using the processor to configure the iterative ECC decoder to operate in the second lower-power and lower-performance operating mode in the event the processor decides to switch operating modes.

12. The method recited in claim 11, wherein:
monitoring includes using a temperature sensor; and
deciding is based at least in part on temperature information from the temperature sensor.

13. The method recited in claim 11, wherein:
monitoring includes obtaining status information from the iterative ECC decoder; and
deciding is based at least in part on the status information.

14. The method recited in claim 11, wherein the iterative ECC decoder includes a low-density parity-check (LDPC) decoder.

15. The method recited in claim 11, wherein:
monitoring includes obtaining a first number of iterations that a soft output Viterbi decoder operated for and obtaining a second number of iterations that the iterative ECC decoder operated for; and
deciding is based at least in part on the first number of iterations and the second number of iterations.

16. The method recited in claim 15, wherein the first number of iterations and the second number of iterations are a number of iterations that the soft output Viterbi decoder and the iterative ECC decoder, respectively, operated on a same sector from a disk storage device.

17. The method recited in claim 11, wherein configuring the iterative ECC decoder to operate in a second lower-power and lower-performance operating mode includes reducing a maximum number of iterations that the iterative ECC decoder can operate for.

18. The method recited in claim 11, wherein configuring the iterative ECC decoder to operate in a second lower-power and lower-performance operating mode includes reducing a first maximum number of iterations that a soft output Viterbi decoder can operate for and/or reducing a second maximum number of iterations that the iterative ECC decoder can operate for.

19. The method recited in claim 11, further comprising:
using the processor to decide whether to return the iterative ECC decoder to the first higher-power and higher-performance operating mode; and
configuring the iterative ECC decoder to operate in the first higher-power and higher-performance operating mode in the event the processor decides to return the iterative ECC decoder to the first higher-power and higher-performance operating mode.

20. A computer program product, the computer program product being embodied in a non-transitory computer readable storage medium and comprising computer instructions for:
configuring an iterative error correction coding (ECC) decoder to operate in a first higher-power and higher-performance operating mode;
monitoring at least some part of a system that includes the iterative ECC decoder;
deciding whether to switch the iterative ECC decoder from the first higher-power and higher-performance operating mode to a second lower-power and lower-performance operating mode based at least in part on the monitoring; and
configuring the iterative ECC decoder to operate in the second lower-power and lower-performance operating mode in the event the computer instructions for deciding decide to switch operating modes.

* * * * *